(12) United States Patent
Sidiropoulos et al.

(10) Patent No.: US 7,849,348 B1
(45) Date of Patent: Dec. 7, 2010

(54) PROGRAMMABLE DELAY CLOCK BUFFER

(75) Inventors: Stefanos Sidiropoulos, Palo Alto, CA (US); Don Stark, Palo Alto, CA (US)

(73) Assignee: NexLogic Microsystems, Inc., Santa Clara, CA (US)

( * ) Notice: Subject to any disclaimer, the term of this patent is extended or adjusted under 35 U.S.C. 154(b) by 706 days.

(21) Appl. No.: 11/781,712

(22) Filed: Jul. 23, 2007

Related U.S. Application Data

(60) Provisional application No. 60/844,232, filed on Sep. 12, 2006.

(51) Int. Cl.
  *G06F 1/00* (2006.01)
  *G06F 1/12* (2006.01)
  *G06F 12/00* (2006.01)
  *H04L 7/00* (2006.01)
  *H03L 7/06* (2006.01)
  *H03K 3/00* (2006.01)

(52) U.S. Cl. .................. 713/500; 713/401; 713/600; 711/105; 711/111; 375/354; 327/146; 327/155; 327/243; 327/291

(58) Field of Classification Search .............. 713/401, 713/500, 600; 711/105, 111; 375/354; 327/146, 327/155, 243, 291
See application file for complete search history.

(56) References Cited

U.S. PATENT DOCUMENTS

| 5,712,583 | A * | 1/1998 | Frankeny | 327/158 |
| 6,535,043 | B2 * | 3/2003 | Chen | 327/291 |
| 7,065,666 | B2 * | 6/2006 | Janzen | 713/400 |
| 7,233,170 | B2 * | 6/2007 | Becker et al. | 326/93 |

OTHER PUBLICATIONS

U.S. Appl. No. 12/728,101, filed Mar. 19, 2010, Loinaz, Marc J.
U.S. Appl. No. 12/728,113, filed Mar. 19, 2010, Loinaz et al.

* cited by examiner

*Primary Examiner*—Stefan Stoynov
(74) *Attorney, Agent, or Firm*—Stattler-Suh PC

(57) ABSTRACT

A programmable delay clock buffer circuit, preferably implemented in a single IC, includes a clock circuit and a plurality of variable delay lines. The clock circuit receives an input clock and is clock feedback signal and generates an intermediate clock. Each of the delay lines is configured to receive the intermediate clock and to receive at least one delay control input. A first variable delay line of the plurality is configured to generate, based on a first delay control input, a first delay from the intermediate clock to produce a clock output signal. A second variable delay line of the plurality is configured to generate, based on a second delay control input, a second delay from the intermediate clock to produce a clock feedback signal. A method of distributing clock with through programmable delay lines is also presented.

47 Claims, 5 Drawing Sheets

PROGRAMMABLE DELAY CLOCK BUFFER

RELATED APPLICATIONS

This application claim benefit of priority under 35 U.S.C. § 119(e) of U.S. Provisional patent application Ser. No. 60/844,232, filed Sep. 12, 2006 and entitled "Programmable Delay Clock Buffer", which is hereby incorporated by reference.

BACKGROUND OF THE INVENTION

1. Field of the Invention

The present invention is directed toward the field of clock circuits, and more particularly to a programmable clock buffer circuit.

2. Art Background

Many clock distribution methods rely on the use of a zero delay buffer (ZDB) integrated circuit (IC). A typical application for such an IC is in a registered dual inline memory module (DIMM) 100, as shown in FIG. 1. The memory module input clock is fed to a phase-locked loop (PLL) based ZDB IC. The PLL-based IC 110 receives the input clock $CK_{IN}$ on a clock input 111. The PLL-based IC 110 outputs a plurality of intermediate clocks ($CK_1$ to $CK_N$) on a clock output 112. These signals are transmitted along an array of printed circuit hoard traces 102 to the DRAM ICs 120-1 to 120-N, and also to register ICs (not shown). Both the DRAM and register ICs are mounted on the memory module.

In addition, the clock feedback output 113 of the ZDB/PLL IC 110, $CK_{fbo}$ is routed on the module and fed back to the clock feedback input ($CK_{fbi}$) on the feedback input 114 of the PLL-based IC 110. The PLL-based IC 110 ensures that the input and feedback clocks are aligned phase-wise. In addition, the length of the feedback wire is matched to those of the output clock wires to ensure a constant (small in typical applications) phase difference between the DRAM and register input clocks and the module input clock. This facilitates buffering with minimal delay, i.e. "zero delay" buffering, under ideal conditions.

Manufacturing variation in the printed circuit board (PCB), the DRAM, and the register ICs results in undesirable timing skews. Minimizing timing skew has typically required an arduous process that involves adjusting the capacitive load at the PLL feedback input. Typically this is done by adjusting the value of a discrete capacitor in order to equalize the skew between the DRAM input clocks and the memory module input clock. In addition, adjustment of the capacitive load at the register clock input must also be performed in order to eliminate skew between the clock at the register input and the clock input to the memory module.

The above methods increase manufacturing cost. Essentially the application specific delay must be hard-wired into the design of the printed circuit board or the IC itself. Thus, individual variations in the components used cannot be accounted for; instead the design-time skew minimization must be based on general statistics about the components that go into the application. This typically limits the application of these minimization techniques to a per-system or per-module basis, as a design change based on each lot of components would be too expensive.

What is needed is a method and/or device that permits minimization of timing skews in an economical fashion.

Further, what is needed is a method and/or device that, even when designed on a per-system or per-system basis, permits tuning at the per-lot level.

SUMMARY OF THE DISCLOSURE

Embodiments of the present invention preserve certain advantages of the prior art while introducing additional flexibility to permit a single design or class of designs to accommodate a wider range of applications. These embodiments not only perform feedback-based synchronization of the distributed clock, but also permit individual tuning of delay within each distribution line. Thus, delays can be tuned to the skews present in the actual components being used for a given manufactured lot. The actual tuning can take place at manufacturing time, at each boot-up, or continuously during operation.

In one aspect, the embodiments of the present invention relate to a programmable delay clock buffer circuit. In some embodiments a programmable delay clock buffer circuit comprises a clock circuit for receiving an input clock and a clock feedback signal and for generating an intermediate clock. The circuit also comprises a plurality of variable delay lines. Each of the delay lines is configured to receive an intermediate clock and to receive at least one delay control input. A first variable delay line of the plurality is configured to generate, based on a first delay control input, a first delay from the intermediate clock to produce a clock output signal. A second variable delay line of the plurality is configured to generate, based on a second delay control input, a second delay from the intermediate clock to produce said clock feedback signal.

Preferably the delay IC further includes a controller block and PLL block on-chip. The controller block provides the control signals to the delay lines, while the PLL receives the input clock and the clock feedback signal, performs a phase-adjustment operation based on the feedback signal, and provides the intermediate clock to the delay lines. Preferably the intermediate clock comprises a plurality of signals.

Consistent with the present invention the first delay and second delay can be identical. However, they are preferably different to compensate for timing skews within the specific implementation. Further, preferably the first delay and the second delay are chosen to minimize a phase difference between said clock output signal and said clock feedback signal.

In another aspect the embodiments of the present invention relate to a dual inline memory module (DIMM) including a programmable clock distribution. For example, a DIMM that includes an IC as described above, as well as a memory integrated circuit tor receiving the clock output signal.

In yet another aspect, the embodiments relate to a method of distributing an input clock. An exemplary method includes steps of providing a first delay control input to a first variable delay line and providing a second delay control input to a second variable delay line. Further, an intermediate clock is provided to both the first variable delay line and the second variable delay line. Then, the first variable delay line generates, based on the first delay control input, a first delay from the intermediate clock to produce a clock output signal. Meanwhile, the second variable delay line generates, based on the second delay control input, is second delay from the intermediate clock to produce a clock feedback signal. Further, phase alignment is performed between the provided input clock and the clock feedback signal to produce the intermediate clock.

DETAILED DESCRIPTION

This disclosure sets forth an architecture for a clock buffer IC which overcomes limitations of conventional zero delay buffers by employing on-chip programmable delay generator(s) to appropriately delay an output clock, a feedback clock, or a plurality of clocks.

Figure 1:
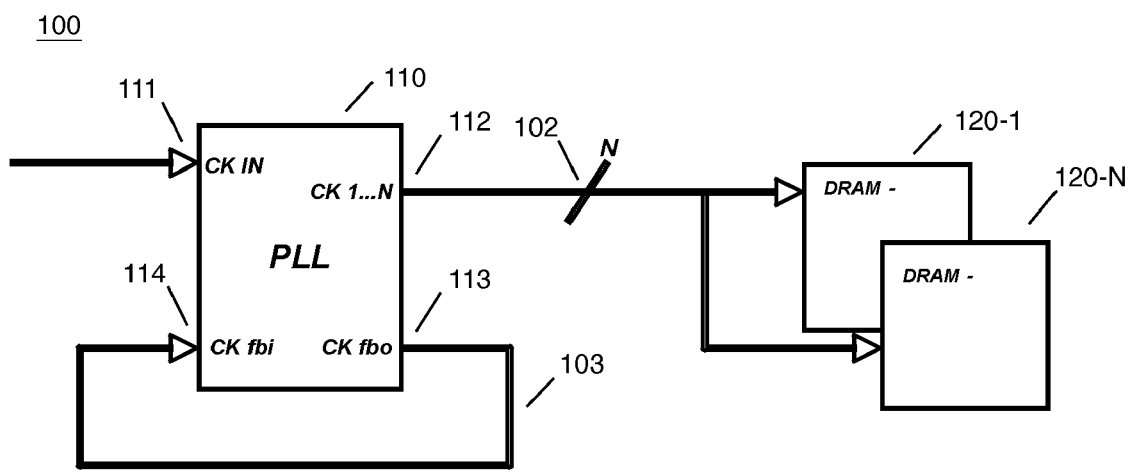
FIG. 1 is a block diagram of a prior art implementation of a phase-locked loop-based zero-delay buffer IC in a dual inline memory module.
Figure 2:
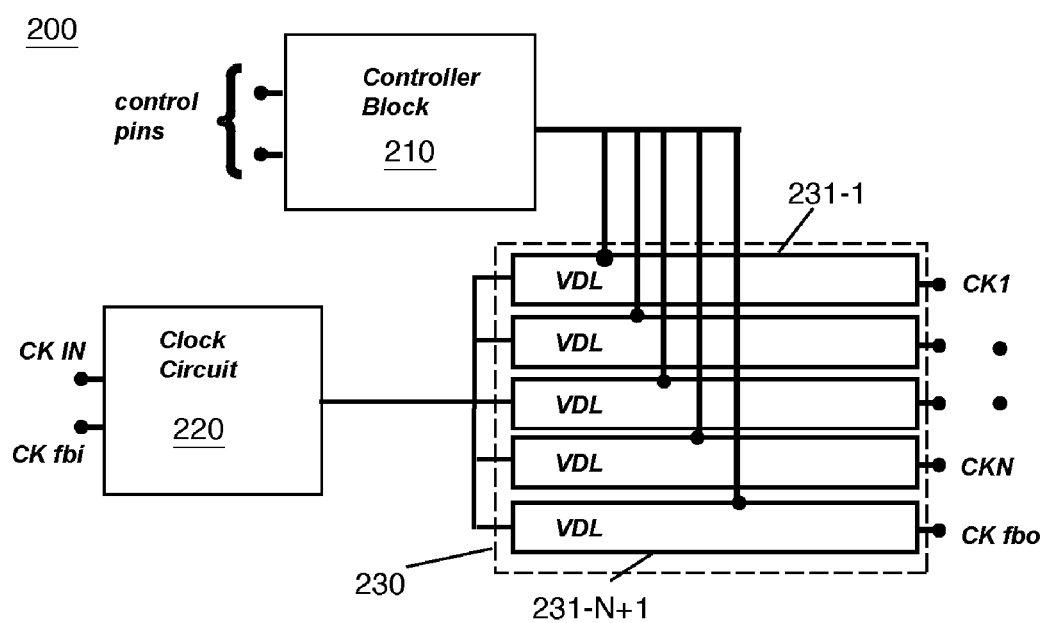
FIG. 2 is a block diagram of a programmable delay buffer IC consistent with some embodiments of the present invention.

FIG. 2 illustrates a functional/block diagram of a programmable delay buffer 200 consistent with some embodiments of the present invention. The programmable delay buffer 200 is preferably implemented in a single IC and comprises a clock circuit 220, a controller module 210, and a delay line assembly 230. In some embodiments the circuit is implemented in more than one IC.

The clock circuit 220 is supplied through two inputs and produces an output; the two input signals are used to generate the output. As illustrated, the clock circuit 220 receives an input clock $CK_{IN}$ and it clock feedback input $CK_{fbi}$. Processing circuitry within the clock circuit 220 uses the inputs to produce an intermediate clock, comprising a signal or set of signals. An exemplary type of clock circuit consistent with the present invention is a PLL-based circuit as described below. Other types of circuits capable of performing the described functions of the clock circuit 220 are also considered.

The intermediate clock of the clock circuit 220 is coupled to the delay line assembly 230. As illustrated, the delay line assembly 230 is an array of N+1 VDLs 231-1 to 231-N+1. The intermediate clock is supplied to each of a plurality of variable delay lines (VDLs) 231-1 to 231-N+1 in the delay line assembly 230. In some embodiments, the intermediate clock comprises at set of signals evenly separated in phase space. In the preferred embodiment, the intermediate clock comprises 8 signals spaced 45 degrees apart. In some embodiments, the VDLs are implemented using interpolators, buffer/multiplexor strings or tapped RC delays. In the preferred embodiment, an interpolator-based VDL can interpolate between the signals of the intermediate clock to produce a delay of between 0 and 360 degrees.

Each VDL 231-x in the delay line assembly 230 includes a control port. As illustrated, each control pin of a VDL is driven by an output of the controller module 210. The controller module 210 supplies a delay control input to each VDL 231-x. Based on the delay control input, each VDL 231-x generates a delay from the intermediate clock. The delayed signal produced by the VDL 231-1 to 231-N are clock output signals $CK_1 \ldots CK_N$ that are distributed off-chip. The delayed signal produced by the VDL 231-N+1 is the clock feedback signal $CK_{fbo}$ that is routed off-chip back to the feedback input $CK_{fbi}$ of the clock circuit 220. Preferably the controller module 210 is mounted on-chip relative to the delay assembly 230 and coupled to externally accessible control pins.

Figure 3:
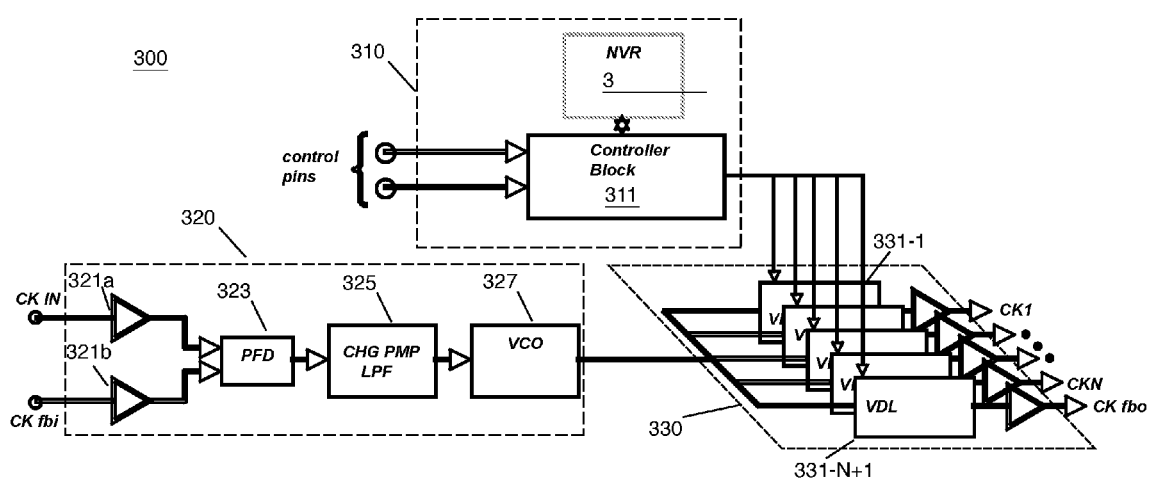
FIG. 3 illustrates a block diagram of a programmable delay butter IC consistent with some embodiments of the present invention.

FIG. 3 illustrates a functional/block diagram of a programmable delay buffer 300 consistent with some embodiments of the present invention. The programmable delay buffer 300 is preferably implemented in a single IC and comprises a phase-locked loop (PLL) module 320, a controller module 310, and a delay line assembly 330. In some embodiments the circuit is implemented in more than one IC.

As illustrated, the PLL module 320 comprises a phase-frequency detector (PFD) 323, a charge pump (CHGPMP)/low pass filter (LPF) block 325, and a voltage controlled oscillator (VCO) block 327. The PLL module 320 is supplied through a first input 321a and a second input 321b and produces an intermediate clock. In the PLL 320, a signal on the second input 321b acts as a phase reference in processing a signal on the first input 321a. As illustrated an input clock $CK_{IN}$ is supplied to clock input 321a and a clock feedback input $CK_{fbi}$ is supplied to feedback input 321b.

The intermediate clock from the VCO 327 of the PLL module 320 is coupled to a plurality of variable delay lines (VDLs) in the delay line assembly 330. As illustrated the delay line assembly 330 is an array of N+1 VDLs 331-1 to 331-N+1. In some embodiments, the VDLs are implemented using interpolators, buffer/multiplexor strings or tapped RC delays.

Each VDL 331 in the delay line assembly 330 includes a control port. As illustrated each control pin of a VDL is driven by an output of the controller module 310. Preferably the controller module is mounted on-chip relative to the delay assembly 330. The controller module 310 includes a controller block 311 coupled to a non-volatile memory (NVR) 311. The controller block may also be coupled to an externally accessible control port.

As illustrated, the VDL outputs drive the output clocks ($CK_1 \ldots CK_N$) as well as the output feedback clock ($CK_{fbo}$). Preferably the VDL outputs are each driven through a butler. Controller module 310 output acts as delay control input for each VDL. Based on these inputs, the VDLs each generate a delay from the intermediate clock they carry to produce a delayed signal. The delayed signals produced by the VDLs 331-1 to 331-N are clock output signals $CK_1 \ldots CK_N$ that are distributed off-chip. The delayed signal produced by the VDL 231-N+1 is the clock feedback signal $CK_{fbo}$ that is typically routed off-chip back to the feedback input $CK_{fbi}$ of the PLL module 320.

Figure 4:
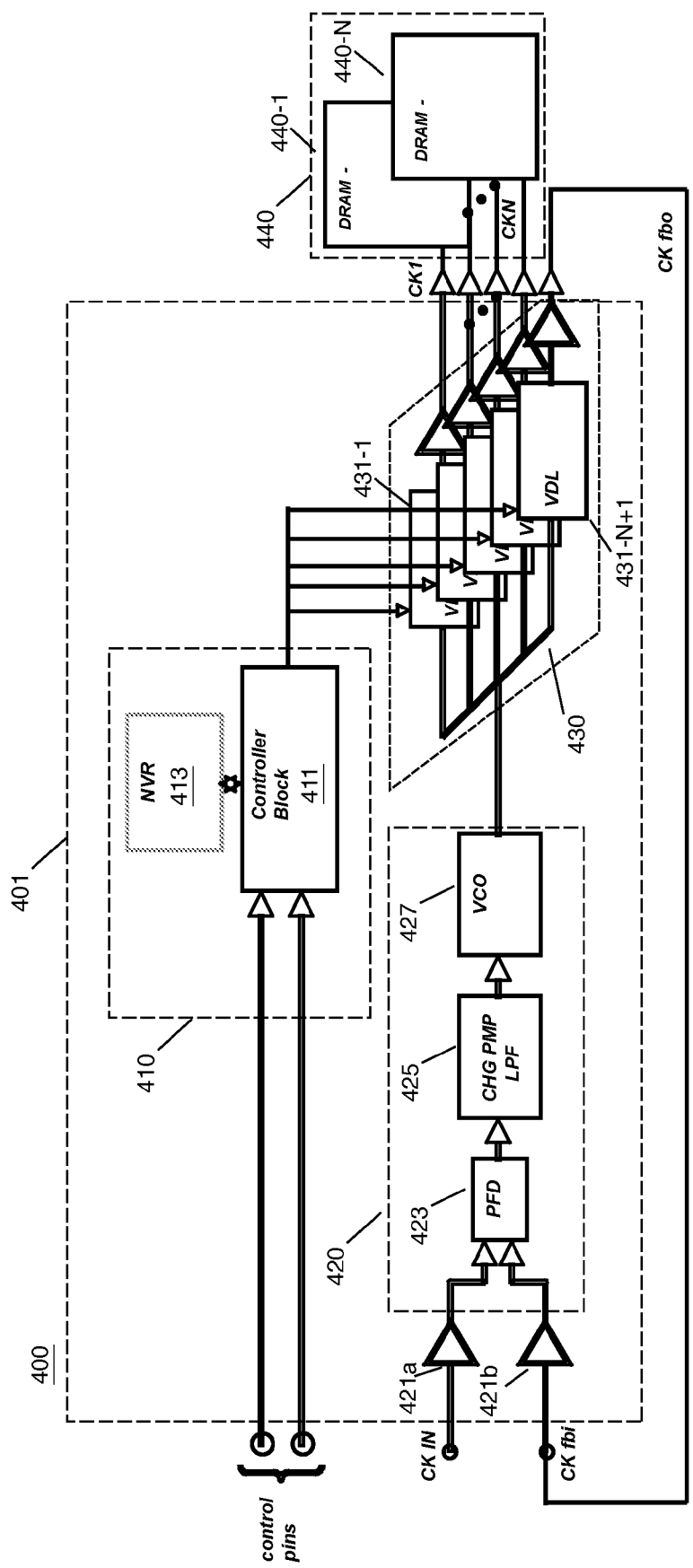
FIG. 4 illustrates a block diagram of a programmable delay buffer IC implemented in a dual inline memory module consistent with some embodiments of the present invention.

In the preferred embodiment, a programmable delay buffer consistent with the present invention is used within a dual inline memory module (DIMM). Such an implementation is shown in FIG. 4, which illustrates the DIMM 400.

As shown, a programmable delay buffer IC 401 includes elements consistent with those of FIG. 3. Namely the IC 401 includes a PLL module 420, it controller module 410, and a delay line assembly 430.

The module 420 receives inputs at 421a and 421b, processes them through a phase frequency detector 423, a charge pump/low-pass filter 425, and a voltage-controlled oscillator 427. The PLL module 420 provides an output of the VCO 427 to the delay line assembly 430.

The delay line assembly 420 includes a plurality of variable delay lines (VDL) 431-1 to 431-N+1 which produce the output clocks $CK_1 \ldots CK_N$ based on control input from the controller module 420. Each VDL control pin is driven by an output of the controller module 420, specifically by an output passed through from the controller block 411.

The NVR 413 and the controller block 411 form the controller module 420. The output of the controller block 411 is based on an input of the externally accessible control pins and on control values set in the NVR 413. The output to each VDL, e.g. 431-1, determines the delay induced within the clock generated by that VDL. These clocks $CK_1 \ldots CK_N$ are in turn provided to drive the memory devices 441-1 to 441-N in the DRAM module 440, or to the PLL module as feedback (here shown as $CK_{fbo}$).

In operation, external inputs to the DIMM include an input clock, any input to the externally accessible control pins, and any control values programmed into the NVR 413. The input clock $CK_{IN}$ is provided to the PLL module 420 through input 421a. The second input 421b is provided by as $CK_{fbi}$ and corresponds to the $CK_{fbo}$ generated at the delay line assembly 430.

Operational Modes

Consistent with embodiments of the present invention, a programmable delay buffer circuit has several modes of operation. Generally, in different modes, differing types of delays are induced within the delay line module. The varying modes described below apply to each illustrated embodiments, e.g. FIG. 3 and FIG. 4, unless explicitly stated.

In a first mode of operation, termed "default" mode, the controller block, e.g. 311 or 411, dictates an equal delay through each VDL, and the programmable delay buffer IC behaves identically to a conventional PLL-based "zero" delay butter IC.

In a second mode of operation, termed "extended" or "programmable" mode, the delay through each VDL is altered to compensate for skews of a specific clock distribution application. The extended mode can be entered in a variety of ways. Examples include issuance of a command on the external control pins, or through some other pins being driven to a specific logic state. In some embodiments the delay through each VDL is altered, but fixed, to compensate for fixed skews in a clock distribution implementation. In some other embodiments, the delay through each VDL is varied during operation, preferably to compensate for anticipated variability in skews in a particular application or class of applications.

In many cases, the skews specific to the application depend on the particular components to which clock is distributed as well as the path the clock must travel. For example, in a DIMM 400, manufacturing variations in clock pin input capacitance of the DRAMs 441-1 to 441-N produce a timing skew among the DRAMs. Variation in the lengths or inherent delays of the individual pins used to distribute clock from the PLL module 420 to the DRAMs 441-1 to 441-N produces another skew.

Preferably, a programmable mode for a DIMM or registered DIMM application consistent with the present invention includes both global delays and pin-wise delays. For example, a fixed offset delay between the $CK_{fbo}$ VDL and the VDL blocks CK1 to CKN compensates for the manufacturing variations of DRAM clock pin input capacitance. Individually tuned delays on each clock signal ($CK_1 \ldots CK_N$ compensate for variations on the delay or length of the clock distribution pins.

Programming

Consistent with the present invention, the specific delays formed in programmable modes of an IC can be fixed during manufacturing, determined at each system boot-up, or re-set on a relatively continuous basis.

In applications, such as registered DIMMs, that do not provide for a delay calibration cycle on boot-up, the extended skew calibration mode is preferably entered during testing and manufacturing. Preferably appropriate control values are stored in a non-volatile memory (NVR). Exemplary NVRs include EEPROM or FLASH memory; the NVR can be located either on-chip or off-chip.

In applications that provide for boot-up calibration cycles, an appropriate delay is preferably set on each boot-up via logic programmed into the controller block. For example, such logic can be programmed into a controller block via firmware.

Algorithms

A programmable clock buffer IC consistent with embodiments of the present invention can implement a variety of algorithms to determine optimal delay times. In some embodiments the controller block implements multiple algorithms that enhance the flexibility of the system. Preferably each algorithm is capable of determining a set of delays that minimize a phase difference between the clock output signals and the clock feedback signal.

A preferred algorithm is on-chip time domain reflectometry (TDR). Preferable implementations of this algorithm include integrated analog-to-digital converters (ADC) and timing digitizers (TD) on the output buffers. In this type of embodiment, the ADC/TD combination estimates the round trip clock insertion delay by measuring the arrival of a reflected clock waveform back to the output buffer.

This method is used in manufacturing calibration, boot-up calibration, or continuous calibration applications. For example, the estimated delay from the ACD/TD combination can be read by testing software during manufacturing. In another example the estimated delay is ready by boot-up calibration firmware within a controller module. In a further example, the estimated delay is read into a continuous feedback control implemented within a control module. Preferably such a loop uses the estimates to repeatedly re-set the delay times to minimize a phase difference between clock output signals and a clock feedback signal.

Hardware

In some embodiments employ VDLs that provide a delay that is proportional to the clock period. The preferred embodiment employs such VDLs and further includes control schemes that permit their use with a variety of clock periods. In these and other embodiments, the controller module includes an algorithm that compares the clock period with the fixed delay of the clock feedback signal and scales control values proportionately to the clock period so as to keep the delay difference between the output clock and the feedback clock (relative to the intermediate clock) constant even as the clock period changes. In various embodiments, this algorithm is used for manufacturing-calibrated, boot-up-calibrated, and continuously calibrated implementations. For example, pre-programmed control values within the NVR can be sealed up when accessed if the controller module detects that the clock period has changed.

As described earlier, the non-volatile memory employed within the present invention is preferably EEPROM or FLASH. The controller modules employed are preferably digital controllers capable of implanting other programmable features, e.g. variable input feedback, output clock division, or programmable spread spectrum generation.

The preferred application of the proposed architecture is clock distribution for memory modules (See Registered DIMM, JEDEC Standard 21-C). However, the proposed architecture can be used in many other systems requiring flexible clock generation and distribution subsystems.

Method

Figure 5:
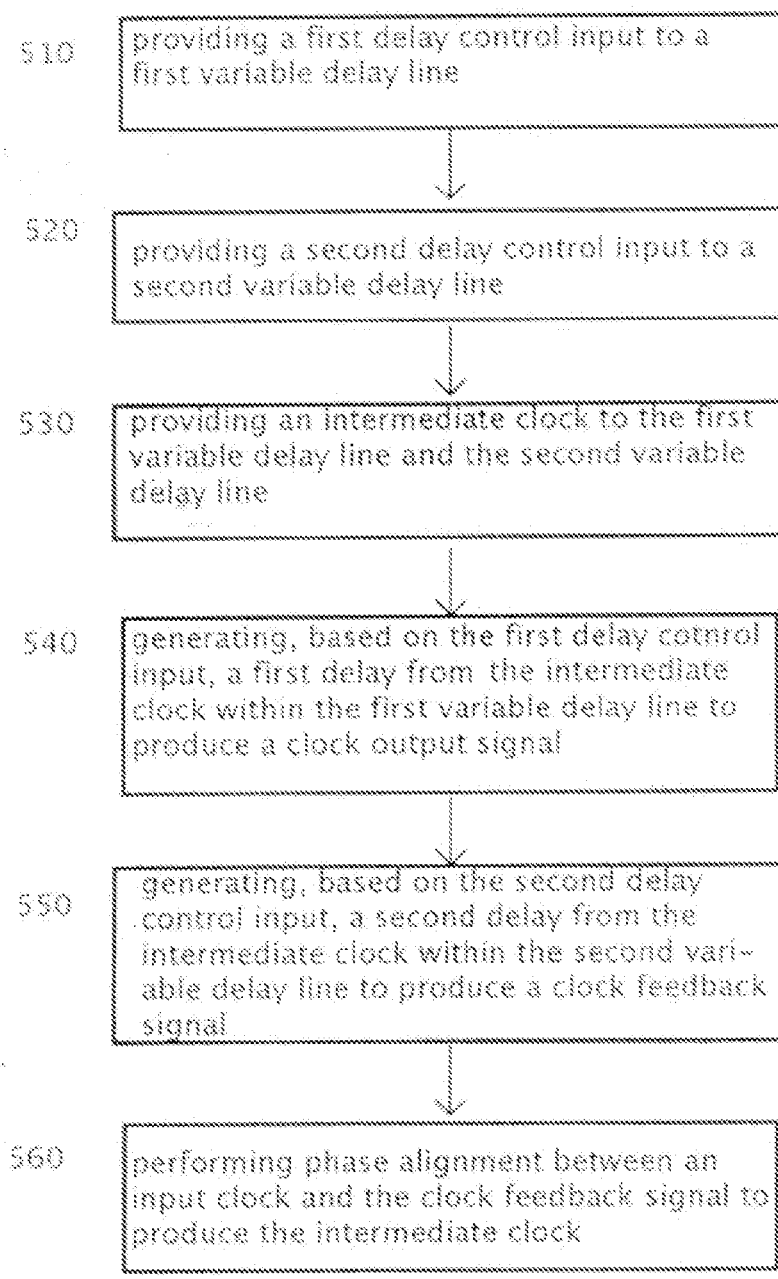
FIG. 5 is a flowchart illustrating a method of distributing an input clock consistent with some embodiments of the present invention.

FIG. 5 illustrates a method of distributing an input clock consistent with the present invention. This method is preformed, for example, in programmable clock buffer ICs consistent with the present invention. In the method, variable delay lines are provided with control signals to configure the delay they induce in carried signals. This occurs in step 510, providing a first delay control input to a first variable delay line, and step 520, providing a second delay control input to a second variable delay line.

Also in the method, the intermediate clock is provided to the delay lines. This occurs in step 530, providing the intermediate clock to the first variable delay line and the second variable delay line. In step 540, which occurs in the first delay line, a first delay in the intermediate clock is generated based on the first delay control input. This produces a clock output signal. Step 550 occurs in the second delay line. It comprises generating, based on the second delay control input, a second delay in the intermediate clock to produce a clock feedback signal.

In a step 560 following at least one repetition of the other steps, phase alignment is performed between the input clock and the clock feedback signal. Preferably the method is performed in a repeated loop and relatively continuously during clock distribution in implementation.

In various modes, the first and second delay can be equal or not equal. For example, in a default mode the first and second delay are equal. In an extended mode, the first and second delay are tuned to compensate for an existing or anticipated timing skew. Preferably the first and second delay are chosen to minimize a phase difference between said clock output signal and said clock feedback signal.

This tuning of the delays can occur at various times relative to the method. It can be set prior to the methods beginning, or it can be continuously re-set contemporaneously with the method. The first case would be consistent with either boot-up calibration or manufacturing calibration. The second case would involve a continuous calibration loop.

Advantages

Embodiments of the present invention preserve certain advantages of the prior art while introducing additional flexibility to permit a single design or class of designs to accommodate a wider range of applications. These embodiments not only perform feedback-based synchronization of the distributed clock, but also permit individual tuning of delay within each distribution line. Thus, delays can be tuned to the skews present in the actual components being used for a given manufactured lot. The actual tuning can take place at manufacturing time, at each boot-up, or continuously during operation.

Though the preferred application envisioned for embodiments of the present invention is in registered memory modules, other possible applications include distribution of reference clocks in an Ethernet switch or on a computer motherboard.

Although the present invention has been described in terms of specific exemplary embodiments, it will be appreciated that various modifications and alterations might be made by those skilled in the art without departing from the spirit and scope of the invention. The scope of the invention is not limited to the exemplary embodiments described and should be ascertained by inspecting the appended claims.

What is claimed is:

1. A programmable delay clock buffer circuit comprising:
   a clock circuit for receiving an input clock and a clock feedback signal and for generating an intermediate clock;
   a plurality of variable delay lines configured to receive said intermediate clock and to receive a plurality of delay control inputs; wherein a first variable delay line is configured to generate, based on a first delay control input, a first delay from said intermediate clock to produce a clock output signal, and a second variable delay line is configured to generate, based on a second delay control input, a second delay from said intermediate clock to produce said clock feedback signal; and
   a controller block configured to provide the delay control input to each variable delay line.

2. The programmable delay clock buffer circuit as set forth in claim 1, wherein said first delay and said second delay are equal.

3. The programmable delay clock buffer circuit as set forth in claim 1, wherein said first delay and said second delay are different.

4. The programmable delay clock buffer circuit as set forth in claim 3, wherein said first delay and said second delay minimize a phase difference between said clock output signal and said clock feedback signal.

5. The programmable delay clock buffer circuit as set forth in claim 1, further comprising input pins, coupled to said controller block, for receiving external input to control generation of the plurality of delay control inputs in said controller block.

6. The programmable delay clock buffer circuit as set forth in claim 1, further comprising a non-volatile memory module coupled to said controller block.

7. The programmable delay clock buffer circuit as set forth in claim 6, wherein said non-volatile memory module is configured to store at least one control value and wherein said controller block uses said control value in generating the delay control input.

8. The programmable delay clock buffer circuit as set forth in claim 7, wherein said control values are stored in said non-volatile memory module during a calibration cycle.

9. The programmable delay clock buffer circuit as set forth in claim 8, wherein during said calibration cycle control values for said first delay control input and said second delay control input are set to minimize a phase difference between said clock output signal and said clock feedback signal.

10. The programmable delay clock buffer circuit as set forth in claim 8, wherein said control values are generated by using a time domain reflectometry technique employed within said controller block.

11. The programmable delay clock buffer circuit as set forth in claim 7, wherein said control values are determined and programmed into said non-volatile memory module during manufacturing and testing of the circuit.

12. The programmable delay clock buffer circuit as set forth in claim 11, wherein control values of said first delay control input and said second delay control input are set to minimize a phase difference between said clock output signal and said clock feedback signal.

13. The programmable delay clock buffer circuit as set forth in claim 11, wherein the values of said control values are generated by using a time domain reflectometry technique.

14. The programmable delay clock buffer circuit as set forth in claim 1, wherein said controller block determines values of said plurality of delay control inputs during operation.

15. The programmable delay clock buffer circuit as set forth in claim 14, wherein during operation said first delay control input and said second delay control input are repeatedly re-set to minimize a phase difference between said clock output signal and said clock feedback signal during a continuous feedback loop.

16. The programmable delay clock buffer circuit as set forth in claim 14, wherein said controller block generates the values of said plurality of delay control inputs using a time domain reflectometry technique.

17. The programmable delay clock buffer circuit as set forth in claim 1, wherein said delay variable lines are of a type that provides a delay proportional to a clock period of said intermediate clock.

18. The programmable delay clock buffer circuit as set forth in claim 17, wherein said controller block compares said second delay with said clock period and scales said first delay control input proportionately to said clock period.

19. The programmable delay clock buffer circuit as set forth in claim 18, wherein the controller block compares the difference between said first delay and said second delay with the clock period and keeps the delay difference constant even as the clock period changes.

20. The programmable delay clock buffer circuit as set forth in claim 1, wherein said plurality of delay control inputs for said plurality of variable delay lines are not all the same.

21. A dual inline memory module comprising a programmable delay clock buffer circuit as set forth in claim 1, and further comprising at least one memory integrated circuit, coupled to said programmable delay clock buffer circuit, for receiving said clock output signal.

22. A dual inline memory module as set forth in claim 21, wherein said memory integrated circuit is a dynamic random access memory IC.

23. A dual inline memory module as set forth in claim 21, wherein said programmable delay clock buffer circuit further comprises input pins, coupled to said controller block, for receiving external input to control generation of said plurality of delay control inputs in said controller block.

24. A dual inline memory module as set forth in claim 21, wherein said programmable delay clock buffer circuit further comprises a non-volatile memory module coupled to said controller block.

25. A dual inline memory module as set forth in claim 24, wherein said non-volatile memory module is configured to store at least one control value and wherein said controller block uses said control value in generating the delay control input.

26. A dual inline memory module as set forth in claim 25, wherein said control values are determined and programmed into said non-volatile memory module during manufacturing and testing of said programmable delay clock buffer circuit.

27. A dual inline memory module as set forth in claim 26, wherein during the manufacturing and testing said first delay control input and said second delay control input are set to values that minimize a phase difference between said clock output signal and said clock feedback signal.

28. A dual inline memory module as set forth in claim 26, wherein during the manufacturing and testing the values of said plurality of delay control inputs are generated by using a time domain reflectometry technique.

29. A dual inline memory module as set forth in claim 21, wherein the intermediate clock comprises a set of signals.

30. A method of distributing an input clock, comprising:
   a. providing a first delay control input from a controller block to a first variable delay line;
   b. providing a second delay control input from the controller block to a second variable delay line;
   c. providing an intermediate clock to said first variable delay line and said second variable delay line;
   d. generating, based on said first delay control input, a first delay from said intermediate clock within said first variable delay line to produce a clock output signal;
   e. generating, based on said second delay control input, a second delay from said intermediate clock within said second variable delay line to produce a clock feedback signal; and
   f. performing phase alignment between said input clock and said clock feedback signal to produce said intermediate clock.

31. The method of claim 30, wherein said first delay and said second delay are equal.

32. The method of claim 30, wherein said first delay and said second delay are different.

33. The method of claim 32, wherein said first delay and said second delay minimize a phase difference between said clock output signal and said clock feedback signal.

34. The method of claim 30, wherein said first delay and said second delay are determined during a calibration step.

35. The method of claim 34, wherein during the calibration step said first delay control input and said second delay control input are set to minimize a phase difference between said clock output signal and said clock feedback signal.

36. The method of claim 34, wherein said first delay and said second delay are generated by using a time domain reflectometry technique.

37. The method of claim 30, wherein the values of said first and second delay control inputs are modified during operation.

38. The method of claim 37, wherein during operation said first delay control input and said second delay control input are repeatedly re-set to minimize a phase difference between said clock output signal and said clock feedback signal using a continuously operating feedback loop.

39. The method of claim 38, wherein values of said first and second delay control inputs are generated using a time domain reflectometry technique.

40. The method of claim 30, wherein said first delay control input and said second delay control input are set via control values supplied from a non-volatile memory module.

41. The method of claim 40, wherein said control values are chosen so that said first delay control input and said second delay control input minimize a phase difference between said clock output signal and said clock feedback signal.

42. The method of claim 41, wherein the values of said control values are generated by using a time domain reflectometry technique.

43. The method of claim 42, wherein said control values are determined and set during a manufacturing and testing step.

44. The method of claim 30, employing the first and the second variable delay line of a type that provides a delay proportional to a clock period of said intermediate clock.

45. The method of claim 44, further comprising a step of comparing the difference between said first delay and said second delay with the clock period and keeping the delay difference constant even as the clock period changes.

46. A method of distributing a clock within a dual inline memory module comprising the method of claim 30 used to distribute a clock signal based on said input clock to at least one memory integrated circuit.

47. The method of claim 30, wherein said intermediate clock comprises a plurality of signals.

* * * * *